United States Patent
Chaudhry et al.

(10) Patent No.: US 6,759,730 B2
(45) Date of Patent: Jul. 6, 2004

(54) BIPOLAR JUNCTION TRANSISTOR COMPATIBLE WITH VERTICAL REPLACEMENT GATE TRANSISTOR

(75) Inventors: Samir Chaudhry, Orlando, FL (US); Paul Arthur Layman, Orlando, FL (US); John Russell McMacken, Orlando, FL (US); Ross Thomson, Clermont, FL (US); Jack Qingsheng Zhao, Orefield, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/956,382

(22) Filed: Sep. 18, 2001

(65) Prior Publication Data

US 2003/0052721 A1 Mar. 20, 2003

(51) Int. Cl.⁷ ............................................. H01L 27/082
(52) U.S. Cl. ........................ 257/586; 257/330; 257/378; 438/138
(58) Field of Search ................................ 257/329, 330, 257/334, 378, 577, 586; 438/138, 268

(56) References Cited

U.S. PATENT DOCUMENTS

| | | | |
|---|---|---|---|
| 4,366,495 A | 12/1982 | Goodman et al. | |
| 4,455,565 A | 6/1984 | Goodman et al. | |
| 4,587,713 A | 5/1986 | Goodman et al. | |
| 4,683,643 A | 8/1987 | Nakajima et al. | |
| 4,786,953 A | 11/1988 | Morie et al. | |
| 4,837,606 A | 6/1989 | Goodman et al. | |
| 4,851,362 A | 7/1989 | Suzuki | |
| 5,001,533 A | 3/1991 | Yamaguchi | |
| 5,252,849 A | * 10/1993 | Fitch et al. | ................. 257/329 |
| 5,342,797 A | 8/1994 | Sapp et al. | |
| 5,414,288 A | * 5/1995 | Fitch et al. | ................. 257/328 |
| 5,414,289 A | 5/1995 | Fitch et al. | |

(List continued on next page.)

OTHER PUBLICATIONS

Dudek, et al, "Lithography–Independent Nanometer Silicon MOSFET's on Insulator", IEEE Transactions on Electron Devices, vol. 43, No. 10, Oct. 1996, pp. 1626–1631.

(List continued on next page.)

Primary Examiner—George Eckert

(57) ABSTRACT

A structure and a process for fabricating a bipolar junction transistor (BJT) that is compatible with the fabrication of a vertical MOSFET is disclosed. In the process, at least three layers of material are formed sequentially on a semiconductor substrate, where the substrate includes a buried collector region for the BJT and a source region for the MOSFET. After the at least three layers are formed on the substrate, two windows or trenches are formed in the layers. The first window terminates at the surface of the silicon substrate where the source region has been formed; the second window terminates at the buried collector region. Both windows are then filled with semiconductor material. For the BJT, the bottom portion of the window is filled with material of a conductivity type matching the conductivity of the buried collector, while the upper region of the semiconductor material is doped the opposite conductivity to form the BJT base. Subsequent processing forms the emitter overlying the base and a MOSFET drain overlying the channel formed within the window. The second layer of the three layers is sacrificial and is completely removed. Upon removal of the sacrificial layer, the channel is exposed and a dielectric layer is grown over the exposed channel region, followed by an overlying gate to complete formation of the BJT.

21 Claims, 8 Drawing Sheets

U.S. PATENT DOCUMENTS

| | | | |
|---|---|---|---|
| 5,576,238 A | | 11/1996 | Fu |
| 5,668,391 A | | 9/1997 | Kim et al. |
| 5,679,972 A | * | 10/1997 | Kim .................. 257/378 |
| 5,744,846 A | | 4/1998 | Batra et al. |
| RE36,311 E | * | 9/1999 | Frisina et al. ............ 438/133 |
| 6,027,975 A | | 2/2000 | Hergenrother et al. |
| 6,072,216 A | | 6/2000 | Williams et al. |
| 6,133,099 A | | 10/2000 | Sawada |
| 6,197,641 B1 | | 3/2001 | Hergenrother et al. |
| 6,294,418 B1 | * | 9/2001 | Nobel .................. 438/212 |
| 6,297,531 B2 | | 10/2001 | Armacost et al. |

OTHER PUBLICATIONS

Risch, et al, "Vertical MOS Transistors with 70 nm Channel Length", IEEE Transactions on Electron Devices, vol. 43, No. 9, Sep. 1996, pp. 1495–1498.

Takato et al, "Impact of Surrounding Gate Transistor (SGT) for Ultra–High–Density LSI's", IEEE Transactions on Electron Devices, vol. 38, No. 3, Mar. 1991, pp. 573–577.

Takato, et al, "High Performance CMOS Surrounding Gate Transistor (SGT) for Ultra High Density LSIs", IEDM 1988, pp. 222–225.

Hergenrother, et al, "The Vertical Replacement–Gate (VRG) MOSFET: A 50–nm Vertical MOSFET with Lithography–Independent Gate Length", Technical Digest of IEDM, 1999, pp. 75–78.

Oh, et al, "50 nm Vertical Replacement–Gate (VRG) pMOS-FETs", IEEE 2000.

Hergenrother, et al, "The Vertical Replacement–Gate (VRG) MOSFET: A High–Performance Vertical MOSFET with Lithography–Independent Critical Dimensions", no publication information apparent form document.

Monroe, et al, "The Vertical, Replacement–Gate (VRG) Process for Scalable, General–purpose Complementary Logic", Paper 7.5, pp. 1–7, date and publication information unknown.

* cited by examiner

BIPOLAR JUNCTION TRANSISTOR COMPATIBLE WITH VERTICAL REPLACEMENT GATE TRANSISTOR

FIELD OF THE INVENTION

The present invention is directed to semiconductor devices incorporating junctions of varying conductivity types and methods of making such devices. More specifically, the present invention relates to a bipolar junction transistor device and methods for fabricating integrated circuits incorporating such devices.

BACKGROUND OF THE INVENTION

Enhancing semiconductor device performance and increasing device density (the number of devices per unit area) continue to be important objectives of the semiconductor industry. Device density is increased by making individual devices smaller and packing devices more compactly. But, as the device dimensions (also referred to as feature size or design rules) decrease, the methods for forming devices and their constituent elements must be adapted. For instance, production line feature sizes are currently in the range of 0.25 microns to 0.12 microns, with an inexorable trend toward small dimensions. However, as the device dimensions shrink, certain manufacturing limitations arise, especially with respect to the lithographic processes. In fact, current lithographic processes are nearing the point where it is not possible to accurately manufacture devices at the required minimal sizes demanded by today's device users.

Currently most metal-oxide-semiconductor field effect transistors (MOSFETs) are formed in a lateral configuration with the current flowing parallel to the major plane of the substrate or body surface. As the size of these MOSFET devices decreases to achieve increased device density, the fabrication process becomes increasingly difficult. In particular, the lithographic process for creating the channel is problematic, as the wavelength of the radiation used to delineate an image in the lithographic pattern approaches the device dimensions. Therefore, for lateral MOSFETs, the gate length is approaching the point where it cannot be precisely controlled through the lithographic techniques.

Recent advances in packing density have resulted in several variations of a vertical MOSFET. In particular, the vertical device is described in Takato, H., et al., "Impact of Surrounding Gates Transistor (SGT) for Ultra-High-Density LSI's, *IEEE Transactions on Electron Devices,* Volume 38(3), pp. 573–577 (1991), has been proposed as an alternative to the planar MOSFET devices. Recently, there has been described a MOSFET characterized as a vertical replacement gate transistor. See Hergenrother, et al, "The Vertical-Replacement Gate (VRG) MOSFET": A 50-nm Vertical MOSFET with Lithography-Independent Gate Length," *Technical Digest of the International Electron Devices Meeting,* p. 75, 1999.

Generally, integrated circuits comprise a plurality of active devices, including MOSFETs, JFETs and bipolar junction transistors, as well as passive components such as resistors and capacitors. Commonly owned U.S. Pat. Nos. 6,027,975 and 6,197,641, which are hereby incorporated by reference, teach certain techniques for the fabrication of vertical replacement gate (VRG) MOSFETs. It is therefore advantageous to fabricate bipolar junction transistors (BJTs) using similar and compatible processing steps as those employed for the fabrication of MOSFETs to reduce integrated circuit fabrication costs.

BRIEF SUMMARY OF THE INVENTION

An architecture and fabrication process is provided for fabricating BJTs using a process compatible with the fabrication of vertical MOSFETs.

According to one embodiment of the invention, a semiconductor device includes a first layer of semiconductor material and a first doped region formed therein. A plurality of semiconductor and insulating layers overlie the first doped region and a window or trench is formed in the plurality of layers. A second doped region of a different conductivity type than the first doped region is overlies the first doped region in the window. A third doped region, also in the window, overlies the second doped region, with a different conductivity type than the second doped region. The first region is a collector region of the BJT and the second region is the base. The third region is the emitter.

In an associated method of manufacture, an integrated circuit structure is fabricated by providing a semiconductor layer suitable for device formation and having a first surface formed along a first plane. A plurality of layers are formed thereover and a window is formed in the plurality of layers. For a BJT device, a first device region is formed in the semiconductor layer, where the device region is the collector. A base region is formed above the collector, and the emitter region formed above the base; both the base and emitter regions are formed in the window.

According to the present invention, BJTs and vertical MOSFETs can be fabricated in the same semiconductor substrate using compatible fabrication processes with minimal additional fabrication steps. That is, both devices are formed from a plurality of shared insulating and semiconductor layers, with certain of the active regions of each device formed in a window in the plurality of layers.

BRIEF DESCRIPTION OF THE DRAWINGS

The present invention can be more easily understood and the further advantages and uses thereof more readily apparent, when considered in view of the description of the preferred embodiments and the following figures in which.

In accordance with common practice, the various described features are not drawn to scale, but are drawn to emphasize specific features relevant to the invention. Reference characters denote like elements throughout the figures and the test.

DESCRIPTION OF THE PREFERRED EMBODIMENTS

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100>plane of a monocrystalline silicon layer on which the bipolar transistor devices are fabricated. For a MOSFET, the term "vertical transistor" means a transistor with individual semiconductor components vertically oriented with respect to the major surface, so that the current flows vertically from drain to source. By way of example, for a vertical MOSFET the source, channel and drain regions are formed in relatively vertical alignment with respect to the major surface. With respect to a BJT, the term "vertical transistor" means the collector, base and emitter regions are formed in a relatively vertical alignment with respect to the major surface. Collector means that portion of a semiconductor layer that performs the collector function of a bipolar transistor device during transistor action, including conduction of current and collection of charge. A collector does not include an adjoining region of similar conductivity type if the absence of such a region will not alter the electrical characteristics of the transistor.

The present invention is directed to a process for fabricating bipolar junction transistors (BJTs) using a process similar to and compatible with the fabrication of vertical replacement gate metal-oxide-semiconductor field-effect transistors (MOSFETs). According to one or more embodiments now described, BJTs and VRG transistors are formed on a single silicon substrate to in a manner which minimizes cost and fabrication complexity, e.g., minimum number of extra mask steps relative to VRG formation. The present invention discloses a BJT device and fabrication process that achieves these goals.

Figure 1A:
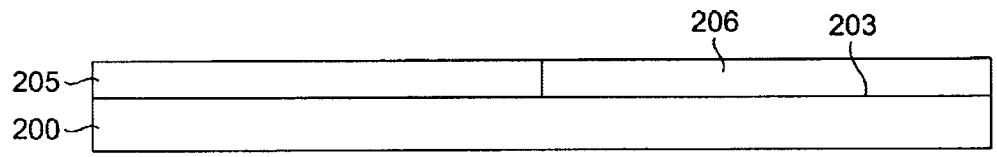
FIGS. 1A through 1Q illustrate in cross-section, a circuit structure according to one embodiment of the invention during sequential fabrication steps.
Figure 1B:
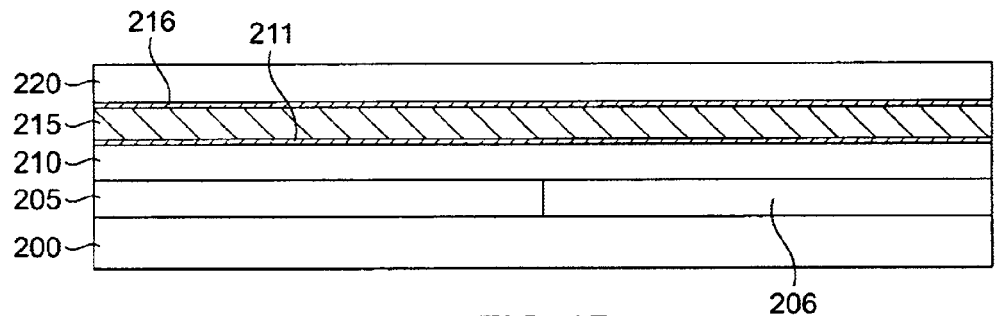
Figure 1C:
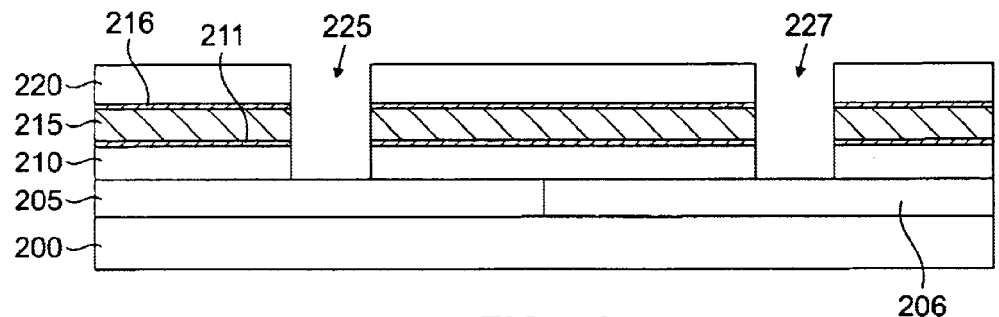
Figure 1D:
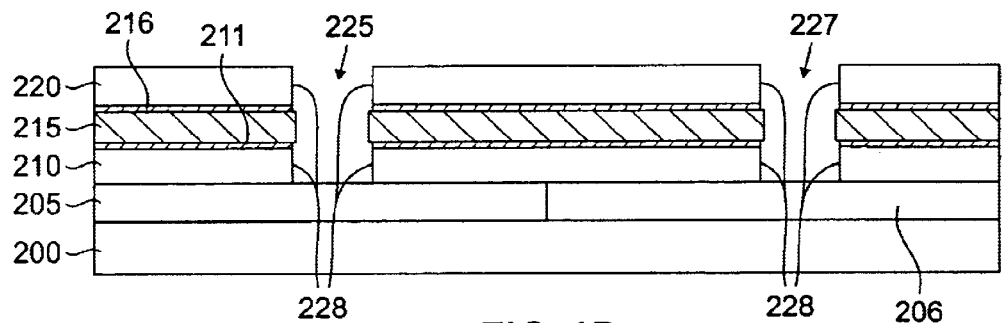
Figure 1E:
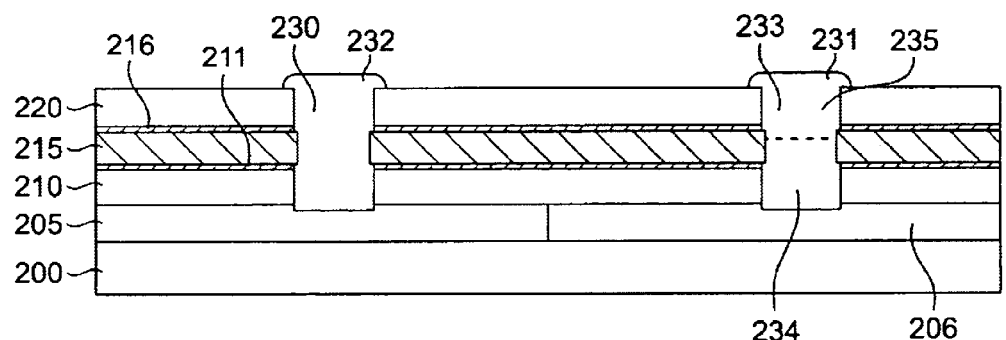
Figure 1F:
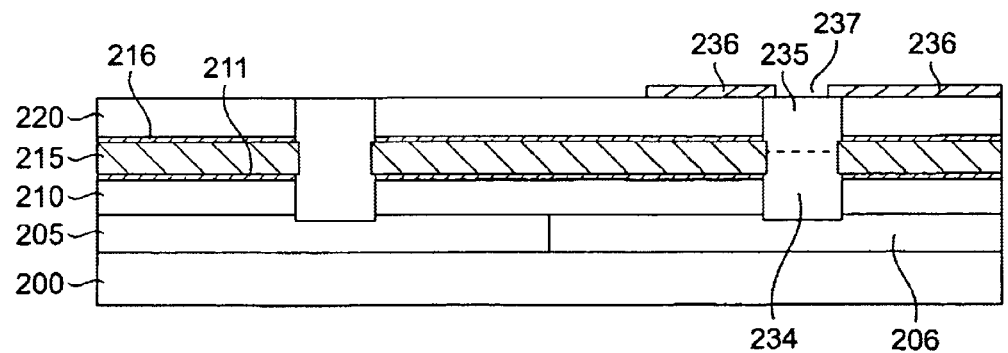
Figure 1G:
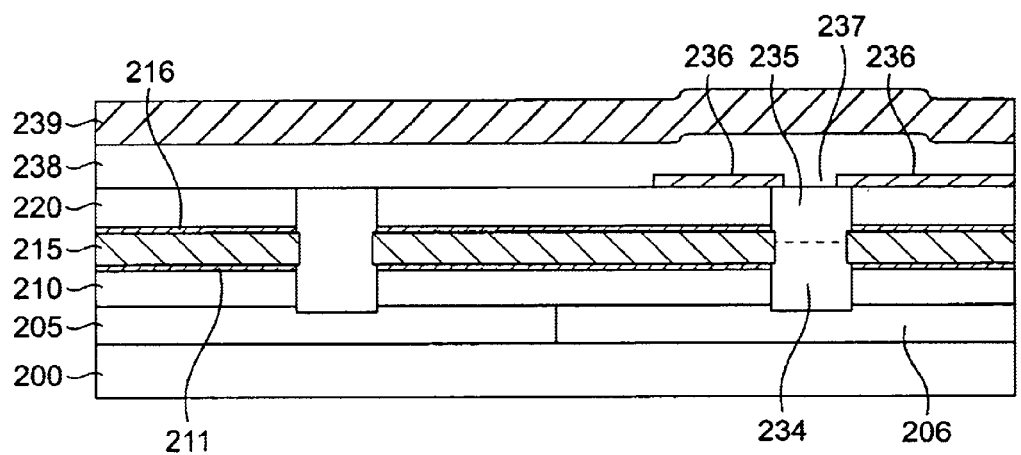
Figure 1H:
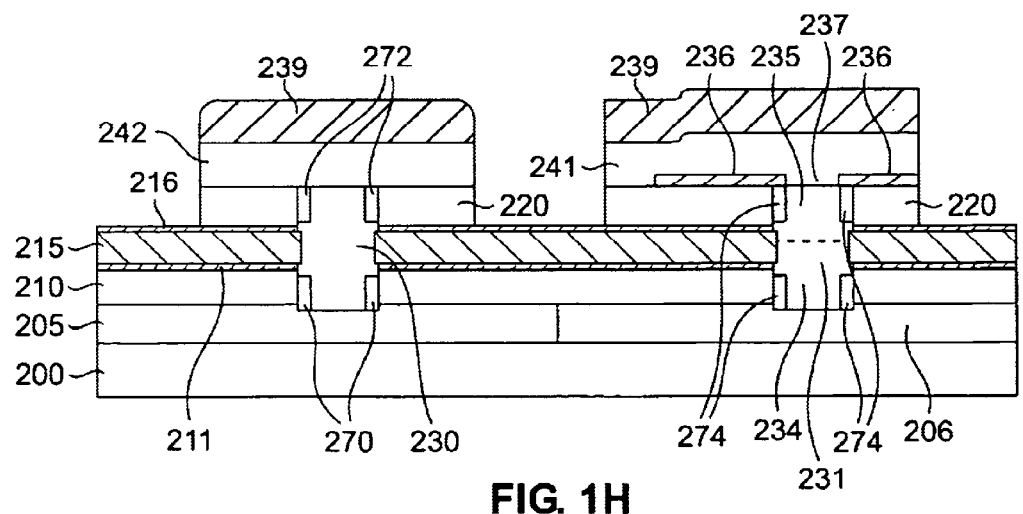
Figure 1I:
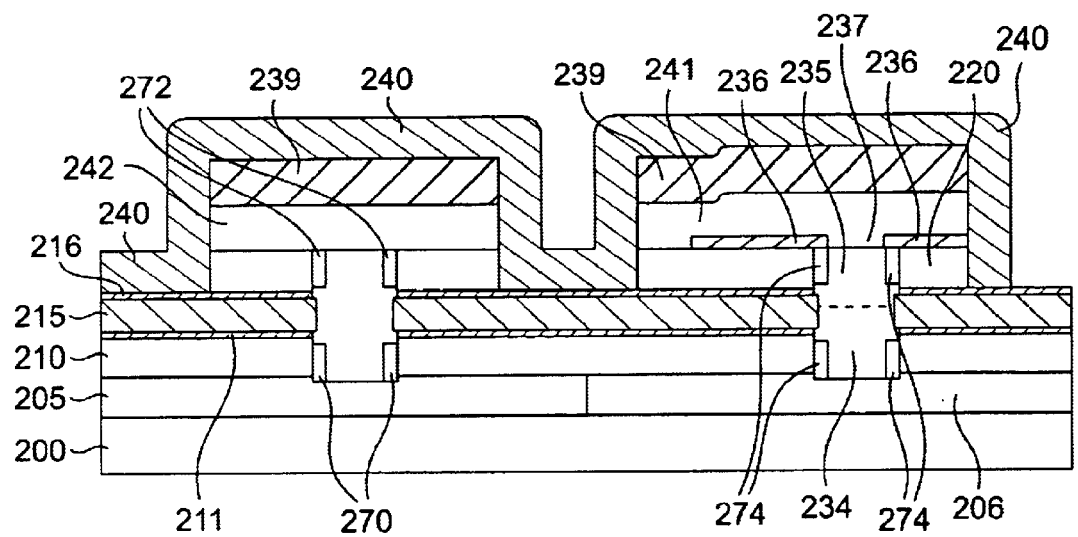
Figure 1J:
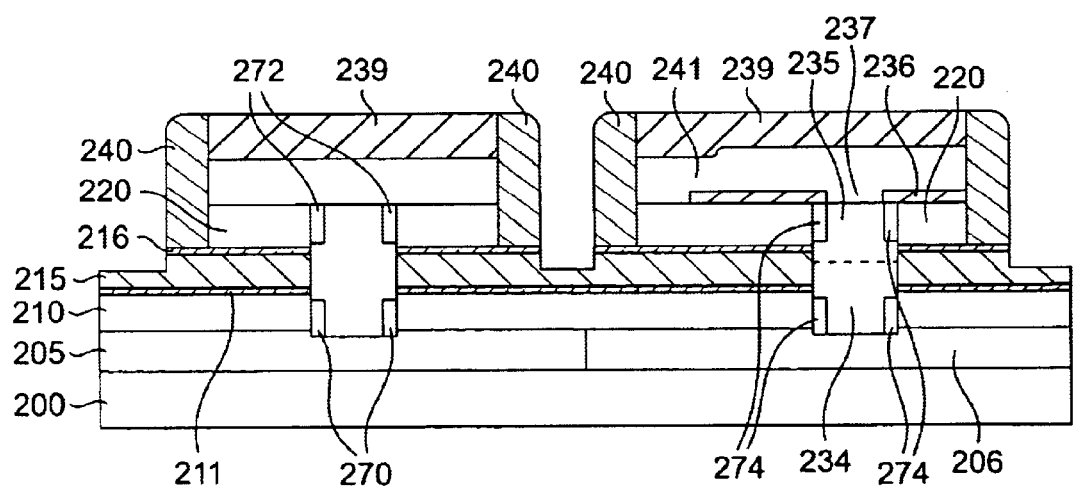
Figure 1K:
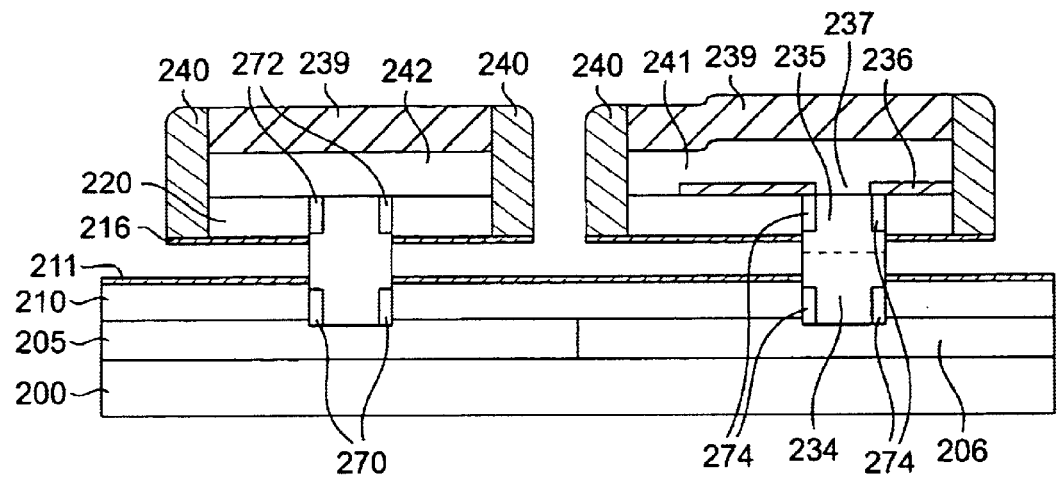
Figure 1L:
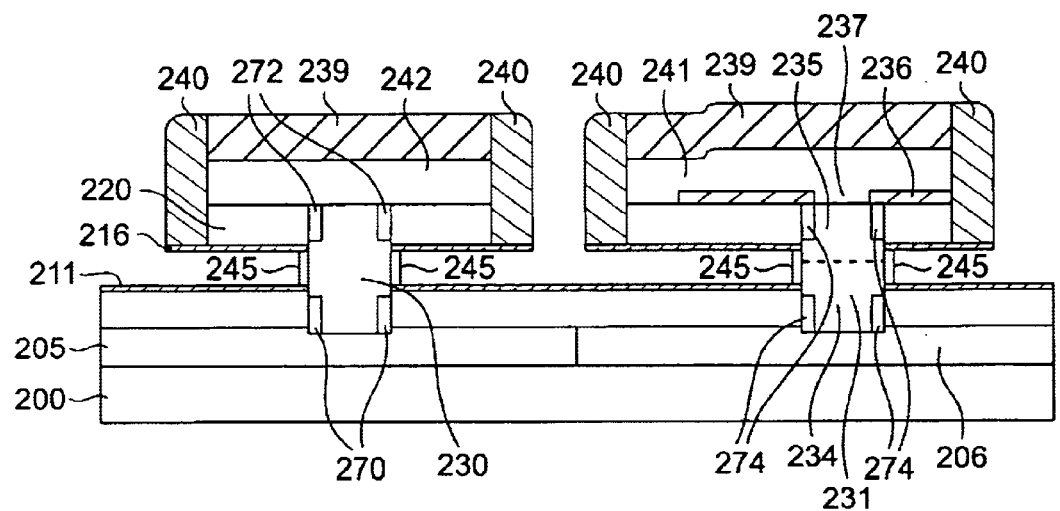
Figure 1M:
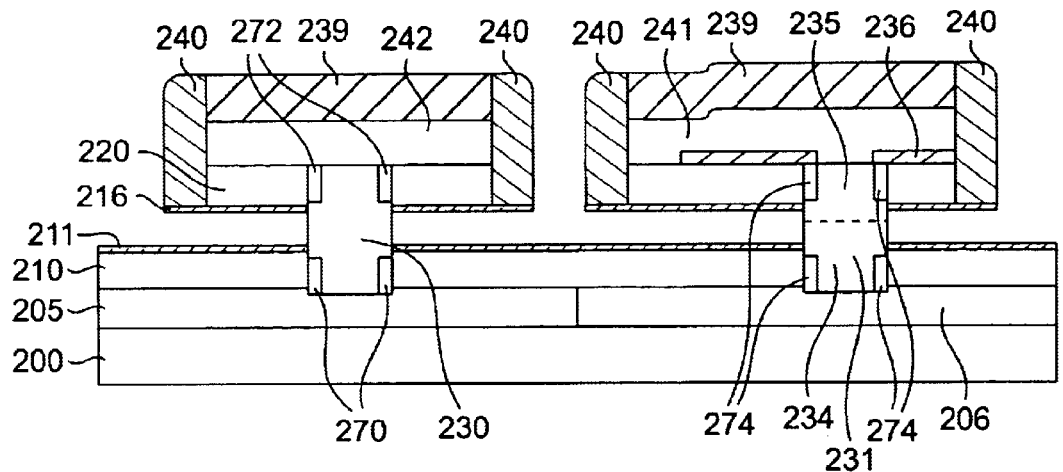
Figure 1N:
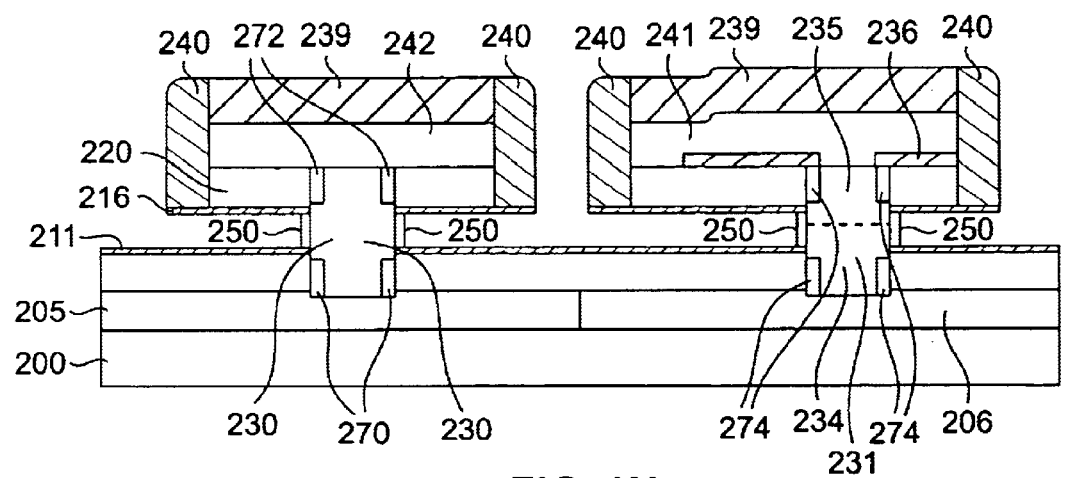
Figure 1O:
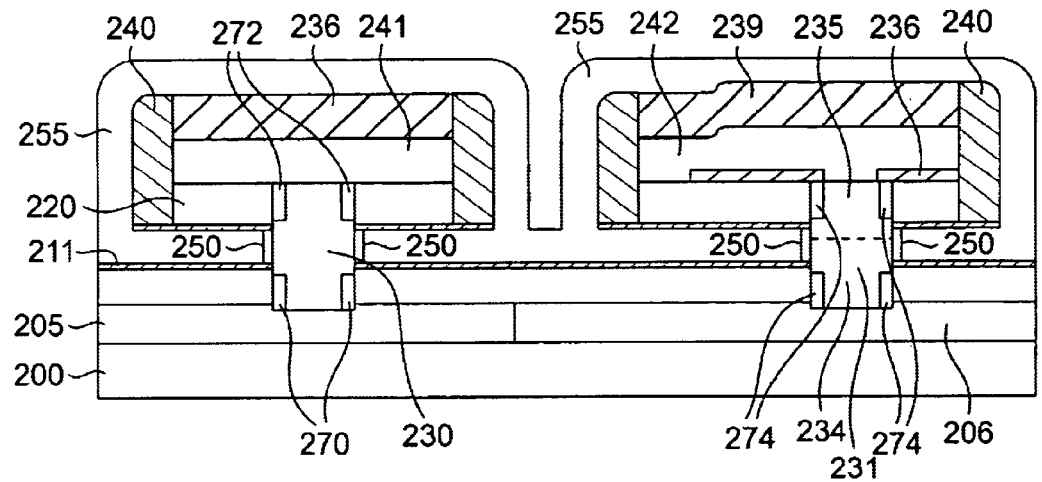
Figure 1P:
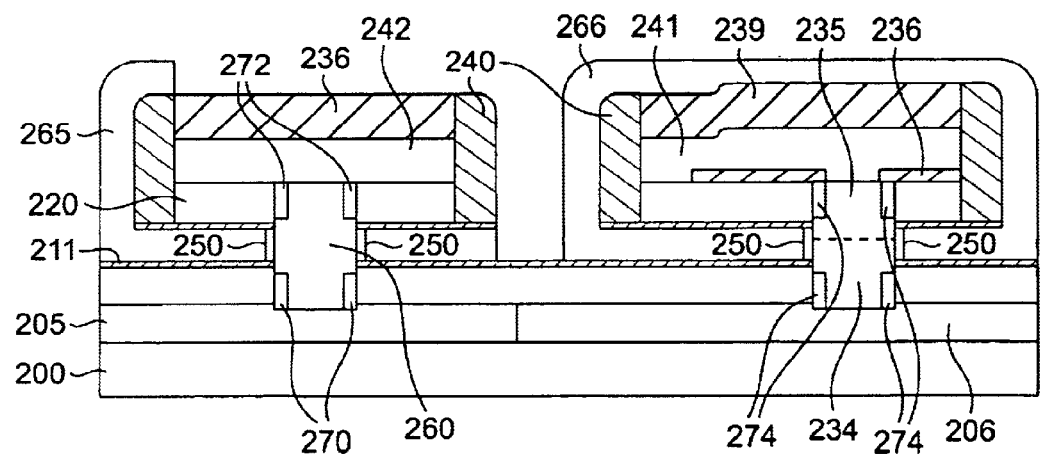
Figure 1Q:
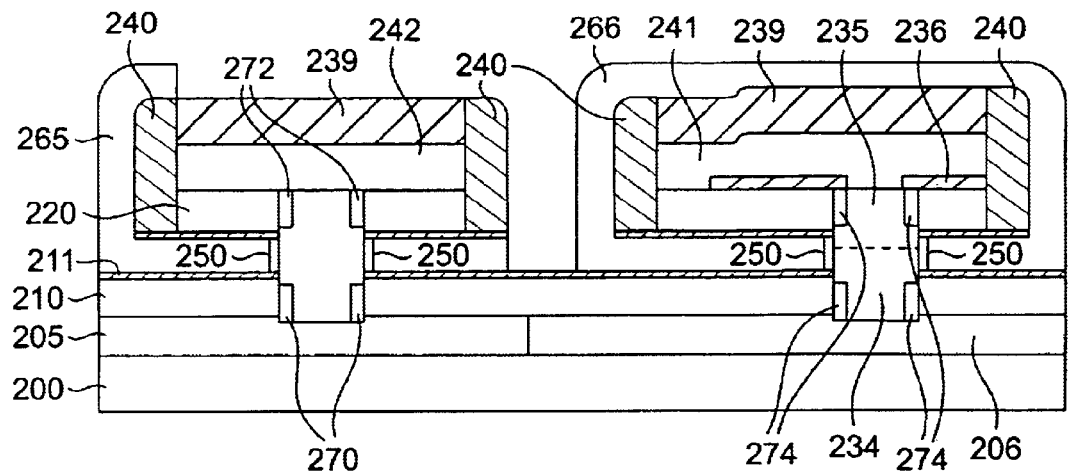

FIGS. 1A through 1Q illustrate cross-sectional views of an integrated circuit structure 200 during various stages of fabrication to form an exemplary device according to the present invention. From the description, it will become apparent how a bipolar junction transistor can be fabricated, either alone or in conjunction with the fabrication of a VRG transistor.

The fabrication process for forming both a VRG MOS-FET and a BJT is illustrated with reference to FIGS. 1A through 1Q. The formation of both a VRG MOSFET and a BJT are illustrated to demonstrate the compatibility of fabricating both device types in a single fabrication process. However, the invention is not limited to embodiments wherein a vertical MOSFET and a BJT are fabricated in a side-by-side orientation or during the same process flow.

The various semiconductor features and regions described herein are preferably based on silicon semiconductor processing, but other embodiments of the invention may be based on different semiconductor materials including compound or heterojunction semiconductors, alone or in combination.

Referring to FIG. 1A, a heavily doped source region 205 is formed in a silicon substrate 200, preferably a substrate having a <100>crystal orientation, along an exposed major surface 203. In this embodiment of a vertical MOSFET, the source region of the device is formed in the silicon substrate and the drain region is formed atop a subsequently formed vertical channel, as will be discussed further. Alternatively, the drain region may be formed in the substrate with the source region formed atop the vertical channel. The former embodiment is the subject of this description. However, from this description it will be apparent that one can easily form a device in which the drain region is formed in the silicon substrate and the source region is formed over the subsequently formed vertical channel.

After forming the heavily doped source region 205 for the MOSFET device, the source region 205 is masked and a buried collector region 206 is formed in the silicon substrate 200. If the source region 205 is doped n-type, then the buried collector region 206 is doped p-type to form one region of a PNP BJT. In the embodiment where the source region 205 is doped p-type, the buried collector region 206 is doped n-type to form an NPN BJT. In another embodiment of the present invention the source region 205 can be doped p-type (or n-type) and the buried collector also doped p-type (or n-type), if some form of isolation, such as a buried insulator-filled trench or a LOCOS region (i.e., local oxidation of silicon), is interposed between the same-dopant type regions.

The depth of the heavily doped source region 205 and the buried collector region 206, the concentration of the dopants therein and the type of dopant (e.g., n-type or p-type) are all matters of design choice. An exemplary source region 205, wherein the dopant is phosphorous (P), arsenic (As), antimony (Sb) or boron (B) has a dopant concentration in the range of about $1 \times 10^{19}$ atoms/cm$^3$ to about $5 \times 10^{20}$ atoms/cm$^3$. Depths of the source region 205 in the substrate 200 of less than about 200 nm are suitable. An exemplary concentration for the buried collector region 206 is also in the range of about $1 \times 10^{19}$ atoms/cm$^3$ to $5 \times 10^{20}$ atoms/cm$^3$. The depth of the buried collector region 206 is typically the same as the depth of the source region. As will become apparent from the description below, the buried collector region 206 has a higher doping concentration than the adjacent collector region (i.e., the active collector region where the majority of the "collector" action occurs), which is formed subsequently and identified by reference character 234 in FIG. 1F. Electrical contact with the collector region 234 is therefore made via the higher-doped buried collector 206, which as a result of the higher doping concentration has a lower resistance In FIG. 1B, multiple material layers are formed over the source region 205 and the buried collector 206. In one embodiment, five layers of material 210, 211, 215, 216 and 220 are formed over the source region 205 and the buried collector 206 in the substrate 200. The insulating layer 210 electrically isolates the source region 205 and the buried collector 206 from the overlying layers. Thus, the insulating layer 210 is composed of a material and has a thickness that is consistent with this insulating objective. Examples of suitable materials include doped silicon oxide. The use of doped insulating layer is advantageous in those embodiments where the insulating layer 210 also serves as a dopant source, as will be explained further, to dope the subsequently formed source/drain extensions of the MOSFET device through a solid phase diffusion process. One example of a silicon dioxide doping source is PSG (phospho-silicate glass, i.e., a phosphorous-doped silicon oxide) or BSG (boro-silicate glass, i.e., a boron-doped silicon oxide). One skilled in the art is aware of suitable expedients for forming a layer of PSG or BSG on a substrate, e.g., plasma-enhanced chemical vapor deposition (PECVD). A suitable thickness for the insulating layer 210 is in the range of about 25 nm to about 250 nm. The insulating layer 210 contains a high dopant concentration on the order of $1 \times 10^{21}$/cm$^3$.

An etch stop layer 211 is formed over the insulating layer 210. An etch stop, as is known to those skilled in the art, is designed to prevent an etch from proceeding to an underlying or overlaying layer or layers. The etch stop therefore has a significantly greater etch resistance to a selected etchant than the adjacent layer. Specifically in this case, for the selected etchant the etch rate of the etch stop layer 211 is much slower than the etch rate of the overlying layer, which, as will be discussed, is a sacrificial layer. According to the present invention, for removal of a sacrificial layer of silicon dioxide (e.g., silicon dioxide formed from tetraethylene ortho silicate (TEOS)), an appropriate etch stop material that limits action of the etchant on the underlying layers is selected. Silicon nitride (Si$_3$N$_4$) is such a suitable etch stop material.

The thickness of the etch stop layer 211 is dependent upon the resistance of the etch stop material to the selected etchant, relative to the material depth to be removed through the etch process. In addition to preventing the etchant from acting on the underlying layer, the etch stop layer 211 serves as an offset spacer and diffusion barrier to the downward diffusion of dopants used to create the source/drain extensions during the solid phase diffusion process, thereby defining the spacing and length of the source/drain extensions relative to the gate. The etch stop layer 211 has a thickness ranging between about 5 nm and about 50 nm.

A sacrificial layer 215 is formed (for example by a TEOS process) over the etch stop layer 211. During subsequent processing steps, the sacrificial layer 215 is removed and the MOSFET gate is formed in the space vacated by the sacrificial layer 215. Thus, the insulating material of the sacrificial layer 215 is chosen such that the etchant has a significantly higher selectivity to remove the sacrificial layer 215 relative to the etch stop layer 211. The thickness of the sacrificial layer 215 is selected to correspond to the channel length of the final MOSFET device. Silicon dioxide is an example of a suitable semiconductor material for the sacrificial layer 215.

In a TEOS process, the decomposition of vaporized liquid TEOS (tetraethyl orthosilicate precursor $(Si(OC_2H_5)_4)$ to form a silicon oxide film (referred to as a TEOS-deposited oxide) typically occurs by chemical vapor deposition (CVD) at 650° C. to 750° C. in an oxygen environment. Such TEOS depositions are known to provide good uniformity and step coverage. Generally, the deposited film is understood to be a non-stoichiometric oxide of silicon, although it is often referred to as silicon dioxide. Inclusion of ozone $(O_3)$, e.g., up to 10 percent of the reacting oxygen, facilitates lower temperature deposition. A typical reaction, which includes ozone, is performed at 400° C. and 300 Torr with 4 standard liters per minutes (slm) oxygen, the oxygen comprising 6 percent ozone, 1.5 slm He and 300 standard cubic centimeters per minute (sccm) TEOS.

An etch stop layer 216 is also formed over the sacrificial layer 215. The etch stop layer 216 serves similar functions to the layer 211, and may, for example, be formed of silicon nitride.

An insulating layer 220 is formed over the etch stop layer 216. Because it is advantageous that the insulating layer 220 have the same etch rate as the insulating layer 210 (for a common etchant), it is preferred that the layers be formed of the same material, e.g., PSG or BSG, which may therefore also serve as a dopant source for the MOSFET source/drain extensions.

All of the layers 210, 211, 215, 216 and 220 may be deposited using conventional chemical vapor deposition (CVD) processes or other well-known deposition techniques. With regard to the aforedescribed sequence of layers, it should be noted that other embodiments may include significant variations, for example, fewer deposited layers. In any case, the resulting structure will be used to form one vertical channel region for the MOSFET device and another region for the BJT device.

Referring to FIG. 1C, openings, windows or trenches 225 and 227 are anisotropically etched through the insulating layer 220, the etch stop layer 216, the sacrificial layer 215, the etch stop layer 211 and the insulating layer 210, to the source region 205 of the MOSFET and the buried collector region 206 of the BJT. The window horizontal dimension, that is the horizontal dimension in the cross-section of FIG. 1D, is determined by the desired performance characteristics of the final device, the size constraints for the device under fabrication and the limitations of the lithographic process utilized to form the windows 225 and 227. The length of the windows 225 and 227, where the length is the distance into the page, is also largely a matter of design choice. The windows 225 and 227 are not required to have the same dimensions. For a given window horizontal dimension, the current capacity of the conductor to be formed later in the window increases with increasing window length.

The windows 225 and 227 are then subjected to a chemical cleaning process, (e.g., RCA or piranha-clean) to clean the silicon at the bottom of the windows 225 and 227. As a result of this cleaning step, a small portion of the insulating layers 210 and 220 forming a boundary with the windows 225 and 227 is removed. The resulting indentations 228 are illustrated in FIG. 1D. Thus the sacrificial layer 215 and the etch stop layers 211 and 216 extend beyond the edge of the insulating layers 210 and 220.

Referring to FIG. 1E, device-quality crystalline semiconductor material (e.g., silicon) 230 and 231 is formed within the windows 225 and 227, respectively. Other examples of crystalline semiconductor materials that can be utilized include silicon-germanium and silicon-germanium-carbon. Techniques for forming crystalline semiconductor material in windows are well known to one skilled in the art. For example, the crystalline semiconductor material can be formed in the windows 225 and 227 epitaxially (i.e., grown from the source region 205 and the buried collector region 206, respectively) or deposited. In another embodiment, amorphous silicon is deposited over the entire substrate 200 and all but the material deposited in the windows 225 and 227 and top portions 232 and 233 at the top of each window, is removed. The amorphous silicon is then annealed, e.g., with a laser, to re-crystallize it.

The crystalline semiconductor material or plug 230 formed in the window 225 must be doped to form the MOSFET channel and the oppositely-doped source and drain extensions, although the latter are typically formed later in the process. A variety of well-known techniques for doping the crystalline semiconductor material 230 to form the channel region are suitable. In-situ doping during formation by epitaxial growth or deposition, or implantation of dopants into the crystalline semiconductor material 230 after it is formed, are suitable processes for creating the channel region. In situ dopant introduction, i.e., as a layer of material is formed via chemical vapor deposition, is well known and not described in detail herein. Generally, the dopants are introduced into the atmosphere at the appropriate point in the deposition process to produce the desired concentration. Any of these techniques are also applicable to the formation of the two oppositely doped regions of the crystalline semiconductor material 231 of the BJT.

The crystalline semiconductor materials 230 and 231 can also be grown or deposited in an undoped condition and then doped by implantation. Since the crystalline semiconductor material 231 for the BJT comprises two dopant types, i.e., the top region 235 forms the base and thus has an opposite dopant type to the underlying collector region 234, two implantation steps are required. In the first step, both regions 234 and 235 are doped a first dopant type by ion implantation. The base region 235 is then formed by counter doping by implanting ions with a suitable energy to change the dopant in the region 234 from the first dopant type to a second dopant type, while the underlying base region 234 remains doped with the first dopant type. Exemplary final dopant concentrations are: $1 \times 10^{19}$ to $5 \times 10^{20}/cm^3$ for the emitter, $1 \times 10^{17}/cm^3$ for the base and $1 \times 10^{16}/cm^3$ for the collector. To form the source/drain extensions at the bottom of the channel for the MOSFET, dopants may be diffused out from the substrate 200 into the bottom of the crystalline semiconductor material 230. Ion implantation is also a suitable expedient for creating the source/drain extension regions at the top of the crystalline semiconductor material 230. Also, as explained in detail below, solid phase diffusion can be employed to diffuse dopants from an adjacent insulating layer into the region of the source/drain extensions.

In yet another embodiment it may be desired to utilize different semiconductor materials for the two BJT regions 234 and 235 in the window 227. Thus, the grown epitaxial layer would not completely fill the window 227, so that another material can then be deposited therein. As realized by those skilled in the art, to achieve the formation of different materials in the window 227 according to this embodiment requires alternately masking off the windows 225 and 227 during certain fabrication steps carried out on the other window.

After the crystalline semiconductor materials 230 and 231 are doped and the dopant distributed therein in the desired manner (in certain embodiments the source and drain extensions have not yet been formed at this point in the process), the substrate should not be subjected to conditions that will significantly affect the distribution of the dopants. Preferably, but not necessarily, after this step, the substrate is not exposed to temperatures that exceed 1100° C. In fact, it is advantageous if the substrate is not exposed to temperatures in excess of 1000° C. after this point in the process. In certain embodiments, the substrate is not exposed to temperatures that exceed 900° C. for prolonged periods of time (e.g. in excess of several minutes). However, the substrate can be subjected to rapid thermal annealing at temperatures of about 1000° C. without adversely affecting the distribution of the dopants. Alternatively, subsequent high temperature processing may be designed to produce the desired dopant distributions.

The top portions 232 and 233 of the crystalline semiconductor materials 230 and 231, are removed, for example, by chemical/mechanical polishing. The result of this process, illustrated in FIG. 1F, planarizes the upper surface of the crystalline semiconductor materials 230 and 231 with the insulating layer 220. Also as shown in FIG. 1F, a silicon nitride layer 236 is formed over the regions of the insulating layer 220 adjacent the base region 235. The nitride layer 236 is preferable to isolate the yet-to-be formed emitter from p-type solid phase diffusions from the BSG material of the insulating layer 220. A window 237 is etched in the silicon nitride layer 236 to access the base region 235. During these process steps, the MOSFET device is masked off.

A conformal layer 238 is formed over the entire structure, including the insulating layer 220 and the silicon nitride layer 236. The layer 238 provides a self-aligned top contact for the MOSFET (the drain contact in this embodiment). One example of a suitable material for the layer 238 is doped polycrystalline silicon, where the dopant is opposite in type to the MOSFET channel dopant. The concentration of the dopant is greater than about $1 \times 10^{20}$ atoms/cm$^3$ in the layer 238.

As further illustrated in FIG. 1G, a conformal layer 239 is deposited over the layer 238. The material selected for the layer 239 is selected to have an etch rate that is significantly slower than the etch rate of the sacrificial layer 215. Preferably, the material selected for the layer 239 is the same as the material of the etch stop layers 211 and 216. One example of suitable material is silicon nitride. The layer 239 is formed over the layer 238 using known techniques.

Using conventional lithographic techniques, the layer 238, the layer 239 and the insulating layer 220 are patterned and etched (using one or more dry etch steps) so that the only remaining portions are those either overlying or adjacent the crystalline semiconductor material 230 or the base 235. See FIG. 1H. The emitter of the BJT is now referred to by reference character 241 and the drain of the MOSFET is referred to by the reference character 242.

In one embodiment, at this point in the process the source/drain extensions are formed by solid phase diffusion from the insulating layers 210 and 220, which had been formed of either PSG or BSG material as discussed above. The dopants are driven into the crystalline semiconductor materials 230 and 231 by solid phase diffusion from the insulating layers 210 and 220 to form source extensions 270 and drain extensions 272 of the MOSFET and region extensions 274 of the BJT. In solid phase diffusion, an oxide (e.g., silicon dioxide) serves as the dopant source. At elevated temperatures, the dopant is driven from the doped oxide to the adjacent undoped (or lightly doped) regions of the crystalline semiconductor materials 230 and 231. This technique is advantageous because the doped area is defined by the interface between the crystalline semiconductor materials 230 and 231 and the insulating layers 210 and 220 that serve as the dopant source. This technique allows the formation of self-aligned source/drain extensions (i.e. the source drain extensions are aligned with the gate). Examples of solid phase diffusion techniques are described in Ono, M., et al, "*Sub-50 nm Gate Length N-MOSFETS with 10 nm Phosphorus Source and Drain Junctions,*" IEDM 93, pp. 119–122 (1993) and Saito, M., et al., "*An SPDD D-MOSFET Structure Suitable for 0.1 and Sub 0.1 Micron Channel Length and Its Electrical Characteristics,*" IEDM 92, pp. 897–900 (1992) which are hereby incorporated by reference.

The concentration of the dopant in that portion of the crystalline semiconductor material 230 that is doped from the insulating layers 210 and 220 is typically at least about $1 \times 10^{19}$/cm$^3$, with dopant concentrations of about $5 \times 10^{19}$/cm$^3$ contemplated as advantageous. With this solid phase diffusion technique, very shallow source and drain extensions 270/272 are obtainable. The source extension 270 and the drain extension 272 are shown as penetrating into the crystalline semiconductor material 230, preferably less than one half the width of the crystalline semiconductor material 230. Limiting the dopant penetrations in this manner avoids the possibility of overlap in the channel region from opposite sides of the crystalline semiconductor material 230. Also, the distance that the source extension 270 and the drain extension 272 extend under the gate dielectric 250 (See FIG. 1N.) is preferably limited to less than one-fourth of the gate length. This distance is controllable by the thickness of the etch stop layers, serving as offset spacers, 211 and 216. As is known to those skilled in the art, the dopants in the source extension 270 and the drain extension 272 are of the opposite type from the dopants in the channel 260 (See FIG. 1P.) of the crystalline semiconductor material 230.

As illustrated in FIG. 1I, a conformal layer 240 is then deposited. For a given etch chemistry, the material for the layer 240 is selected to have an etch rate that is significantly slower than the etch rate of the sacrificial layer 215. One example of a suitable material for the layer 240 is silicon nitride. The thickness of the layer 240 is selected so that the remaining portions of the drain 242, the emitter 241, the layer 239 and the insulating layer 220 are protected from contact with subsequent etchants.

The layer 240 is then etched using an anisotropic etch, such as dry plasma etch, which also removes a portion of the etch stop layer 216. Therefore, as shown in FIG. 1J, the only portions of the layer 240 that remain after the anisotropic etch are sidewall portions laterally adjacent the insulating layer 220, the drain 242, the emitter 241 and the layer 239. As a result of this etch process, portions of the etch stop layer 211 have been removed and the sacrificial layer 215 is now exposed.

The device is then subjected to a wet etch (e.g., an aqueous hydrofluoric acid) or an isotropic dry etch (e.g., an anhydrous hydrofluoric acid), which removes the exposed remaining portion of the sacrificial layer 215. The result is illustrated in FIG. 1K, where the insulating layer 210 is still covered by the etch stop layer 211. The insulating layer 220 and the drain 242 are encapsulated by the remaining portion of the etch stop layer 216 and the layers 239 and 240. Consequently, the remaining portions of the insulating layers 210 and 220 and the drain 242 remain isolated from contact with subsequent etch expedients. The region of the crystalline semiconductor material 230 exposed by removal of the sacrificial layer 215 defines the physical channel length of the MOSFET device. Also, the emitter 241 and the insulating layer 220 within the region of the BJT are protected by the layers 239 and 240, and the etch stop layer 216.

Referring to FIG. 1L, a sacrificial layer of thermal silicon dioxide 245 is grown on the exposed surface of the crystalline semiconductor materials 230 and 231 (the latter including the collector region 234 and the base region 235) to a thickness on the order of less than about 10 nm. The sacrificial silicon dioxide 245 is removed (see FIG. 1M) using a conventional isotropic etch (e.g. an aqueous hydrofluoric acid). As a result of the formation and removal of the sacrificial silicon dioxide 245, the surface of each of the crystalline semiconductor materials 230 and 231 is smoother and some of the sidewall defects are removed. The etch stop layers 211 and 216 prevent the expedient from contacting the insulating layers 210 and 220 and the drain 242. This step is not required, but its inclusion may be desirable if there are excessive defects in the crystalline semiconductor materials 230 and 231.

Next, a layer of gate dielectric or gate oxide 250 is formed on the exposed portion of the crystalline semiconductor materials 230 and 231. See FIG. 1N. Suitable dielectric materials include, for example, thermally grown silicon dioxide, silicon oxynitride, silicon nitride or metal oxide. The thickness of the gate dielectric 250 is about 1 nm to about 20 nm. One example of a suitable thickness is 6 nm. In one embodiment, the silicon dioxide layer is formed by heating the substrate to a temperature in a range of about 700° C. to about 1000° C. in an oxygen-containing atmosphere. Other expedients for forming the gate dielectric 250 include chemical vapor deposition, jet vapor deposition or atomic layer deposition, all of which are contemplated as suitable. Conditions for forming the gate dielectric 250 of the desired thickness are well known to those skilled in the art.

Referring to FIG. 1O, a gate is formed surrounding the gate dielectric 250, by depositing a layer 255 of sufficiently conformal and suitable gate material (e.g., a layer of doped amorphous silicon in which the dopant is introduced in situ and then re-crystallized to form polycrystalline silicon). Preferably, this step is accomplished under conditions that do not significantly affect the dopant profiles of the dopants in the crystalline semiconductor materials 230 and 231. Other examples of suitable gate electrode materials include doped polycrystalline silicon, doped silicon-germanium and doped silicon-germanium-carbon. Metals and metal-containing compounds, that have a suitably low resistivity and are compatible with the material of the gate dielectric 250 and the other semiconductor processing steps, are also contemplated as suitable gate materials. Examples of such metals include titanium, titanium nitride, tungsten, tungsten silicide, tantalum, tantalum nitride and molybdenum. It is advantageous if the gate material has a work function approximately near the middle of the band gap of the semiconductor plug material 230. Suitable expedients for forming the gate include chemical vapor deposition, electroplating and combinations thereof.

Referring to FIG. 1P, the layer 255 is patterned to form the gate 265 of the MOSFET device and a control terminal 266 of the BJT device. Configuration of the gate 265 is largely a matter of design choice. The gate 265 surrounds the crystalline semiconductor material 230 and the gate oxide 250, which form a channel 260 of the MOSFET. In the region of the BJT, the control terminal 266 can be patterned as desired and left floating (i.e., unconnected to any other conductive layers) or connected to the base region 235 by an interconnect in the third dimension outside the plane of the page.

FIG. 1Q shows the finished structure. Access to the MOSFET drain 242 is achieved by etching a window in the insulating layer 239. The BJT emitter 241 is accessed by etching a window in the layer 255 and the insulating layer 239. Both the MOSFET source region 205 and the BJT buried collector region 206 are accessed in the third dimension outside the plane of the FIG. 1Q cross-section. The BJT base region 235 is also accessed in the third dimension.

In yet another embodiment, a thin layer (e.g., a thickness of about 25 nm) of undoped silicon dioxide is formed over the source region 205. Referring to FIG. 1E, this layer (not shown) acts as a barrier to undesirable solid phase diffusion from the insulating layer 210 (the dopant source), down through the source region 205 and then up into the crystalline semiconductor material 230 as the latter is formed.

Figure 2:
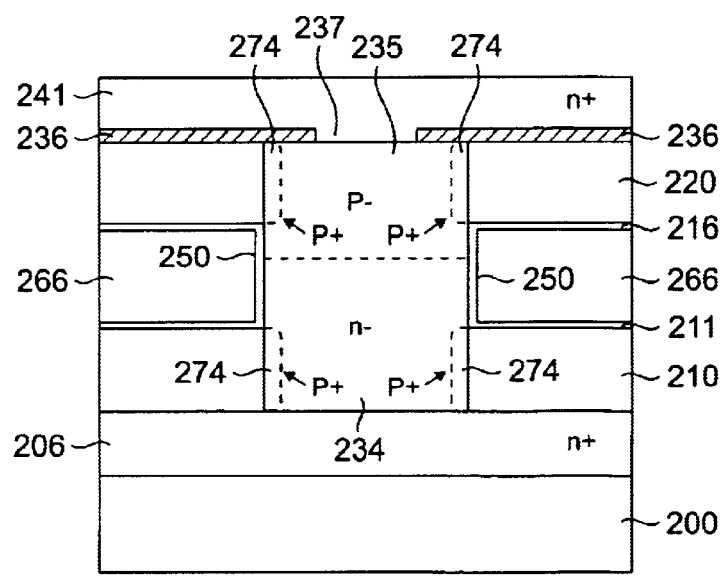
FIG. 2 is a cross-section of a bipolar junction transistor structure according to one embodiment of the invention.

A cross-section representation of a NPN BJT constructed according to the teachings of the present invention in accordance with the aforedescribed fabrication process flow is illustrated in FIG. 2. Each of the layers and regions shown in FIG. 2 corresponds with the like numbered layer or region from FIGS. 1A through 1Q. In this example, the emitter 241 is doped n+, the base 235 is doped p, the collector region 234 is doped n and the buried collector 206 is doped n+. Thus, a conventional NPN BJT transistor is formed. Fabrication of an NMOS VRG device allows the formation of a PNP BJT transistor. Thus, in CMOS integrated circuits having both PMOS and NMOS VRG devices, both NPN and PNP transistors can be formed in accordance with the teachings of the present invention with few additional steps required in the process flow. The extensions 274 are formed in the BJT simultaneously with formation of the source and drain extensions 270 and 272 of the MOSFET. The extensions 274 are not necessary for operation of the BJT but have no detrimental affect. The oxide 250, which is formed simultaneously with the oxide of the MOSFET, prevents a short between the collector 234 and the base 235 via the gate 255.

Advantageously, in one embodiment, the control terminal 266 of the BJT forms a separate conductive region to which a voltage can be applied and when operative in conjunction with the oxide 250, can therefore control or modify certain performance characteristics of the bipolar junction transistor through field-effect action, i.e., either the depletion, inversion or accumulation of mobile charge carriers within the field-effect region. For example, the application of an appropriate voltage to the layer control terminal 266 can form a depletion regions within the collector region 234 and the base region 235. Thus the applied voltage controls the current flow through the collector 234 and the base 235. The applied voltage can also be used to control the breakdown voltage or the gain (i.e., the ration of the input power to the output power of the BJT) of the BJT. Like a MOSFET gate, the control terminal presents a high input impedance.

The embodiments described above are provided to illustrate specific examples of processes that utilize the present invention. One skilled in the art will appreciate that there are many process sequences, materials and expedients that are useful for practicing the present invention. The present invention is not to be construed as limited to the illustrative examples, except as is consistent with the appended claims.

What is claimed is:

1. An integrated circuit structure comprising:
   a semiconductor layer having a major surface along a plane;
   a first doped region of a first conductivity type adjacent to said major surface;
   at least three layers of material formed over said first doped region, wherein a second layer is disposed between a first and a third layer, and wherein said first layer is adjacent to said first doped region;
   a second doped region within a lower portion of a trench formed within said at least three layers of material, wherein said second doped region is of first conductivity type;
   a third doped region within an upper portion of said trench, wherein said third doped region is of a second conductivity type; and
   a fourth doped region of the first conductivity type disposed outside the trench overlying said third doped region.

2. The integrated circuit structure of claim 1 wherein the first doped region forms a buried collector, the second doped region forms a collector, the third doped region forms a base and the fourth doped region forms an emitter of a bipolar junction transistor.

3. The integrated circuit structure of claim 1 further comprising an insulating layer disposed between the third doped region and the fourth doped region, wherein the insulating layer includes a window therein allowing contact between the third and the fourth doped regions through the window.

4. The integrated structure of claim 1 wherein the first and the third layers comprise insulating layers, and wherein the second layer is a sacrificial layer.

5. The integrated circuit structure of claim 1 further comprising an oxide material adjacent the outer wall of the trench in the region where the second and the third doped regions contact, and further comprising a conductive material in electrical communication with the oxide material, wherein said conductive material forms a control terminal of the integrated circuit structure.

6. The integrated circuit structure of claim 5 wherein the control terminal is electrically connected to the third doped region.

7. The integrated circuit structure of claim 5 wherein a voltage is applied to the control terminal for creating a field effect in the region where the second and the third doped regions contact, such that the voltage controls operational parameters of the integrated circuit structure.

8. An integrated circuit structure comprising:
   a semiconductor layer having a major surface along a plane;
   a first doped source/drain region of a first conductivity type formed on a first region of said major surface;
   at least three layers of material formed over said first doped source/drain region;
   a channel region formed within a first trench formed within said at least three layers of material and overlying said first source/drain region;
   a second doped source/drain region vertically aligned with said channel region;
   a dielectric layer adjacent said channel region;
   a conductive element adjacent said dielectric layer to control the conductivity of said channel region by the application of a voltage to said conductive element;
   a third doped region formed on a second region of said major surface;
   at least three layers of material formed over said third doped region;
   a fourth doped region formed within the lower portion of a second trench formed within said at least three layers of material and overlying said third doped region;
   a fifth doped region of opposite conductivity type to said fourth doped region overlying said fourth doped region within an upper portion of said trench;
   a sixth doped region overlying said fifth doped region.

9. The integrated circuit structure of claim 8, wherein the first doped source/drain region is doped a first conductivity type, the channel region is doped a second conductivity type, the second doped source/drain region is doped the first conductivity type, the third doped region is doped the second conductivity type, the fourth doped region is doped the second conductivity type, the fifth doped region is doped the first conductivity type and the sixth doped region is doped the second conductivity type.

10. The integrated circuit structure of claim 9, wherein the first doped source/drain region, the channel region and the second doped source/drain region comprise a MOSFET, and wherein the third doped region comprises a first collector region, the fourth doped region comprises a second collector region, the fifth doped region comprises a base region and the sixth doped region comprises an emitter region of a BJT.

11. The integrated circuit structure of claim 8, wherein the first doped source/drain region is doped a second conductivity type, the channel region is doped a first conductivity type, the second doped source/drain region is doped the second conductivity type, the third doped region is doped the second conductivity type, the fourth doped region is doped the second conductivity type, the fifth doped region is doped the first conductivity type and the sixth doped region is doped the second conductivity type.

12. The integrated circuit structure of claim 11, wherein the first doped source/drain region, the channel region and the second doped source/drain region comprise a MOSFET, and wherein the third doped region comprises a first collector region, the fourth doped region comprises a second collector region, the fifth doped region comprises a base region and the sixth doped region comprises an emitter region of a BJT, and wherein the integrated circuit structure further comprises an insulative material interposed between the first doped source/drain region and the third doped region.

13. An integrated circuit structure comprising:
   a semiconductor region having a major surface along a plane;
   a first doped region of a first conductivity type adjacent said major surface;

a second doped region of a first conductivity type overlying said first doped region;

a third doped region of a second conductivity type overlying said second doped region;

a fourth doped region of the first conductivity type overlying said third doped region;

wherein in operation, a junction between said second doped region and said third doped region is reverse biased and a junction between said third doped region and said fourth doped region is forward biased;

an oxide layer laterally adjacent said second doped region, said third doped region or both said second and third doped regions, wherein said oxide layer is substantially perpendicular to the junction between said second and said third doped regions; and a conductive layer adjacent said oxide layer for controlling the conductivity of the semiconductor material in said second doped region, said third doped region, or both of said second and said third doped regions in response to a voltage applied to the conductive layer.

14. The integrated circuit structure of claim 13 wherein the application of a selected voltage to the conductive layer can form a depletion, an accumulation or an inversion region in the second doped region, the third doped region, or in both the second and the third doped regions.

15. The integrated circuit structure of claim 13 wherein the application of a voltage to the conductive layer controls the current in the second doped region, the third doped region, or in both the second and the third doped regions.

16. The integrated circuit structure of claim 13 wherein the conductive layer forms a high impedance input terminal for the integrated circuit structure.

17. The integrated circuit structure of claim 13 wherein the first doped region forms a buried collector, and wherein the second doped region forms a collector, and wherein the third doped region forms a base, and wherein the fourth doped region forms an emitter of a bipolar junction transistor device, and wherein the voltage applied to the conductive layer controls the gain of the bipolar junction transistor device.

18. The integrated circuit structure of claim 13 wherein the first doped region forms a buried collector, and wherein the second doped region forms a collector, and wherein the third doped region forms a base, and wherein the fourth doped region forms an emitter of a bipolar junction transistor device.

19. The integrated circuit structure of claim 13 wherein in response to the application of a voltage to the conductive layer, the breakdown voltage of the second doped region, the third doped region, or both the second and the third doped regions is controlled.

20. The integrated circuit structure of claim 13 wherein in response to the application of a voltage to the conductive layer, the gain of the integrated circuit structure is controlled.

21. The integrated circuit structure of claim 13 wherein in response to the application of a voltage to the conductive layer, a voltage-controlled capacitor is formed adjacent the second doped region, the third doped region, or both the second and the third doped regions.

* * * * *